United States Patent
Hague et al.

(10) Patent No.: US 9,680,468 B2
(45) Date of Patent: Jun. 13, 2017

(54) BIDIRECTIONAL POWER SWITCH WITH IMPROVED SWITCHING PERFORMANCE

(71) Applicant: STMicroelectronics (Tours) SAS, Tours (FR)

(72) Inventors: Yannick Hague, Mettray (FR); Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 14/957,984

(22) Filed: Dec. 3, 2015

(65) Prior Publication Data

US 2016/0344384 A1    Nov. 24, 2016

(30) Foreign Application Priority Data

May 20, 2015  (FR) ..................................... 15 54494

(51) Int. Cl.
| | |
|---|---|
| H03K 17/72 | (2006.01) |
| H03K 17/735 | (2006.01) |
| H01L 29/74 | (2006.01) |
| H01L 29/747 | (2006.01) |
| H03K 17/725 | (2006.01) |
| H03K 17/06 | (2006.01) |
| H03K 17/16 | (2006.01) |
| H03K 17/74 | (2006.01) |

(52) U.S. Cl.
CPC ......... *H03K 17/735* (2013.01); *H01L 29/747* (2013.01); *H01L 29/7408* (2013.01); *H01L 29/7412* (2013.01); *H03K 17/06* (2013.01); *H03K 17/16* (2013.01); *H03K 17/725* (2013.01); *H03K 17/74* (2013.01); *H03K 2017/066* (2013.01)

(58) Field of Classification Search
CPC .......................... H03K 17/735; H01L 29/747
USPC ........................................................ 327/438
See application file for complete search history.

(56) References Cited

U.S. PATENT DOCUMENTS

| | | | |
|---|---|---|---|
| 4,905,119 A | 2/1990 | Webb | |
| 5,889,374 A * | 3/1999 | Pezzani | H01L 29/747 |
| | | | 318/400.09 |
| 6,326,648 B1 | 12/2001 | Jalade et al. | |
| 7,262,442 B2 * | 8/2007 | Menard | H01L 29/747 |
| | | | 257/107 |
| 2003/0090271 A1 | 5/2003 | Hurwicz | |
| 2004/0026711 A1 | 2/2004 | Gimonet et al. | |

(Continued)

OTHER PUBLICATIONS

Rizk, et al: "A vertical bidirectional bipolar power switch (BipAC) for AC mains applications," 16th European Conference on Power Electronics and Applications (EPE'14—ECCE Europe), 2014 (10 pages).

*Primary Examiner* — Lincoln Donovan
*Assistant Examiner* — Metasebia Retebo
(74) *Attorney, Agent, or Firm* — Gardere Wynne Sewell LLP

(57) ABSTRACT

A bidirectional power switch includes first and second thyristors connected in antiparallel between first and second conduction terminals of the switch. The first thyristor is of an anode-gate thyristor, and the second thyristor is of a cathode-gate thyristor. The gates of the first and second thyristors are coupled to a same control terminal of the switch by respective dipole circuits. At least one of the dipole circuits is formed by at least one diode or at least one resistor.

19 Claims, 1 Drawing Sheet

(56) References Cited

U.S. PATENT DOCUMENTS

2013/0278235 A1 10/2013 Divan et al.
2013/0320395 A1 12/2013 Menard et al.

* cited by examiner

BIDIRECTIONAL POWER SWITCH WITH IMPROVED SWITCHING PERFORMANCE

PRIORITY CLAIM

This application claims the priority benefit of French Application for Patent No. 1554494, filed on May 20, 2015, incorporated by reference in its entirety to the maximum extent allowable by law.

TECHNICAL FIELD

The present disclosure relates to a bidirectional power switch.

BACKGROUND

Many types of bidirectional power switches have already been provided. Such switches are, for example, used series-connected with a load to be powered between terminals of provision of an alternating current (AC) power supply voltage (for example, the mains voltage), to control the power supplied to the load.

There is a need for a bidirectional power switch overcoming all or part of the disadvantages of known switches.

SUMMARY

Thus, an embodiment provides a bidirectional power switch comprising first and second thyristors connected in antiparallel between first and second conduction terminals of the switch, the first thyristor being an anode-gate thyristor, the second thyristor being a cathode-gate thyristor, and the gates of the first and second thyristors being coupled to a same control terminal of the switch, wherein at least one diode or at least one resistor separates the gate of the first thyristor from the gate of the second thyristor.

According to an embodiment, a first dipole couples the gate of the first thyristor to the control terminal and a second dipole couples the gate of the second thyristor to the control terminal, each of the first and second dipoles being a resistor, a diode, a series association of a diode and of a resistor, or a conductive wire or a conductive track, and at least one of the first and second dipoles comprising a diode or a resistor.

According to an embodiment, the first dipole is a diode having its anode connected to the gate of the first thyristor and having its cathode connected to the control terminal, and the second dipole is a diode having its anode connected to the gate of the second thyristor and having its cathode connected to the control terminal.

According to an embodiment, the first and second thyristors are of the type turning on in quadrant Q1.

According to an embodiment, the first dipole is a diode having its cathode connected to the gate of the first thyristor and having its anode connected to the control terminal, and the second dipole is a diode having its cathode connected to the gate of the second thyristor and having its anode connected to the control terminal.

According to an embodiment, the first and second thyristors are of the type turning on in quadrant Q2.

According to an embodiment, at least one of the first and second dipoles comprises a resistor having a value greater than 10 ohms.

According to an embodiment, the first and second thyristors are arranged in a same protection package comprising four external connection terminals respectively connected to the first and second conduction terminals of the switch, to the anode gate of the first thyristor, and to the cathode gate of the second thyristor, and the first and second dipoles are arranged outside of the package.

According to an embodiment, the first and second thyristors and the first and second dipoles are arranged in a same protection package comprising three external connection terminals respectively connected to the first and second conduction terminals and to the control terminal of the switch.

According to an embodiment, the first and second dipoles are integrated in the semiconductor chip(s) comprising the first and second thyristors.

According to an embodiment, the first and second dipoles are discrete components placed on the semiconductor chip (s) comprising the first and second thyristors.

According to an embodiment, the first and second thyristors are arranged in different semiconductor chips.

According to an embodiment, the first and second thyristors are integrated in a same semiconductor chip and are separated by an insulating region.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
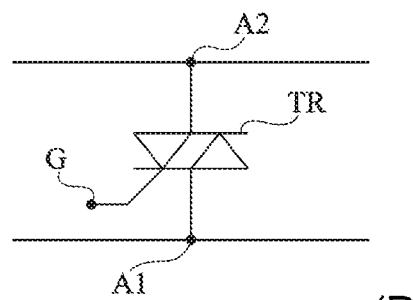
FIG. 1 is a simplified representation of an example of a bidirectional power switch.

The same elements have been designated with the same reference numerals in the different drawings. In the present description, term "connected" will be used to designate a direct electric connection, with no intermediate electronic component, for example, by means of one or a plurality of conductive tracks or of one of a plurality of conductive wires, and term "coupled" or term "linked" is used to designate either a direct electric connection (then meaning "connected") or a connection via one or a plurality of intermediate components (resistor, capacitor, diode, etc.). Unless otherwise specified, expressions "approximately", "substantially", and "in the order of" mean to within 20%, preferably to within 10%.

In the present disclosure, bidirectional power switch means a switch bidirectional for current and voltage capable of withstanding relatively high voltages in the off state, for example, voltages greater than 100 V and typically in the order of 600 V or more.

Bidirectional power switches of the type comprising an antiparallel association of two thyristors is here more particularly considered.

In such a switch, one of the thyristors is used to conduct current having a first biasing, and the other thyristor is used to conduct current of opposite biasing. The turning-on of such a switch is obtained by applying, on a control terminal of the switch, a control signal capable of causing the turning-on of the forward-biased thyristor. The switch is naturally turned off when the intensity of the current that it conducts falls below a conduction threshold of the active thyristor (the previously turned on thyristor), or hold current (IH) of this thyristor.

A problem which arises is that on turning-off of such a switch, for example, at the end of a halfwave of the load power supply signal, a charge overlap phenomenon causing the inversion of the current flowing through the active thyristor occurs. Normally, such a reverse current ends up being equal to zero, and the switch remains off until the next application of a turn-on signal on its control terminal. However, if the intensity and the duration of the reverse current flowing through the active thyristor are too high, there is a risk of spurious (non-controlled) turning-on of the other thyristor (the inactive thyristor) due to carrier transfers which may occur between the two thyristors. In practice, the duration and the amplitude of the reverse current flowing through the active thyristor on switching thereof from the on state to the off state depends on the decrease slope of the current flowing through the switch and on the growth slope of the voltage reapplied across the switch during the switching. The greater these slopes, the greater the overlap current, and the greater the risk of spurious turning-on of the inactive thyristor.

In certain applications, for example, motor control applications, it is important to have bidirectional switches with good switching performances, that is, capable of turning off with no risk of spurious turning back on when the variation slopes of the power signal seen by the switch are significant.

In practice, to respect the switching performance constraints required in certain applications, circuit designers should take relatively constraining precautions, which may in particular lead to increasing the cost of the device. For example, to obtain the desired switching performance, circuit designers are often led to selecting switches which are oversized with respect to the effective needs of the application in terms of current intensity and of voltage amplitude seen by the switch. They may further be compelled to connect across the switch a filtering circuit, for example, a resistor-capacitor (RC) circuit, to increase the robustness of the switch to spurious starts.

FIG. 1 is a simplified representation of a triac TR. Triacs are among the most conventional bidirectional power switches. A triac corresponds to the antiparallel association of two thyristors (not shown in the drawing). The anode of the first thyristor and the cathode of the second thyristor are connected to a first main terminal or conduction terminal A1 of the triac. The cathode of the first thyristor and the anode of the second thyristor are connected to a second main terminal or conduction terminal A2 of the triac. Gate or control terminal G of a conventional triac corresponds to the gate of the two thyristors forming it. The control signals applied to gate G are referenced to one of the two conduction terminals A1 and A2.

A conventional triac is a monolithic component, that is, the two thyristors forming it are formed in a same semiconductor chip. No insulation is generally provided between the two thyristors, which may share same semiconductor layers, particularly at the level of their active portions. Carrier transfers are thus capable of occurring between the two thyristors, which limits the switching performance of such a component.

Figure 2:
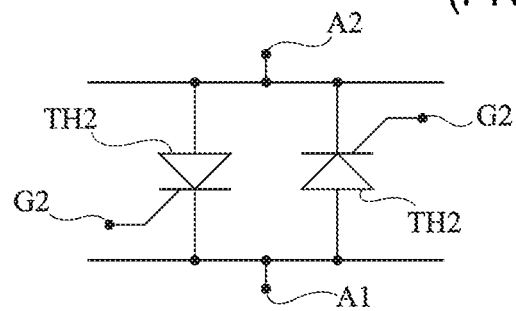
FIG. 2 is a simplified representation of another example of a bidirectional power switch.

FIG. 2 is a simplified representation of another example of a bidirectional power switch. The switch of FIG. 2 comprises two cathode-gate thyristors TH1 and TH2 connected in antiparallel. In this example, thyristors TH1 and TH2 are insulated from each other, that is, they are formed in different semiconductor chips, or they are integrated in a same semiconductor chip but their active portions are separated by insulating region. The anode of the thyristor TH1 and the cathode of thyristor TH2 are connected to a first main terminal or conduction terminal A1 of the switch. The cathode of thyristor TH1 and the anode of thyristor TH2 are connected to a second main terminal or conduction terminal A2 of the switch. The cathode gates of thyristors TH1 and TH2 are connected to two control terminals G1 and G2 insulated from each other.

If the voltage between terminals A1 and A2 is positive, the switch turning-on is obtained by applying to control terminal G2 a control signal referenced to conduction terminal A2, capable of causing the turning-on of thyristor TH2. If the voltage between terminals A1 and A2 is negative, the switch turning-on is obtained by applying to control terminal G1 a control signal referenced to conduction terminal A1, capable of causing the turning-on of thyristor TH1.

In such a switch, thyristors TH1 and TH2 being insulated from each other, risks of carrier transfers between the two thyristors and of spurious turning-on of the inactive thyristor during the turning-off of the active thyristor are low. Such a switch thus has a very good switching performance. However, a disadvantage of such a switch is that it comprises two insulated control terminals referenced to different conduction terminals of the switch. This switch thus requires a relatively complex control circuit.

Figure 3:
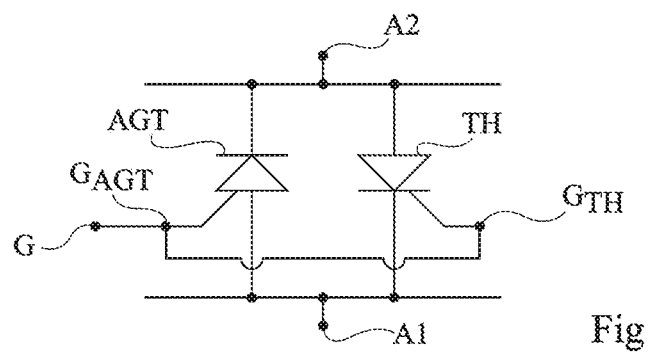
FIG. 3 is a simplified representation of another example of a bidirectional power switch.

FIG. 3 is a simplified representation of another example of a bidirectional power switch. The switch of FIG. 3 comprises a cathode-gate thyristor TH and an anode-gate thyristor AGT connected in antiparallel. As in the example of FIG. 2, the two thyristors TH and AGT are insulated from each other, that is, they are formed in different semiconductor chips, or they are integrated in a same semiconductor chip but separated from each other by an insulating region. The anode of thyristor AGT and the cathode of thyristor TH are connected to a first main terminal or conduction terminal A1 of the switch. The cathode of thyristor AGT and the anode of thyristor TH are connected to a second main terminal or conduction terminal A2 of the switch. Cathode gate $G_{TH}$ of thyristor TH and anode gate $G_{AGT}$ of thyristor AGT are connected to a same control terminal G of the switch.

The turning-on of the switch is obtained by applying on control terminal G a control signal referenced to conduction terminal A1, capable of turning on thyristor AGT if the voltage between terminals A1 and A2 is positive, and of turning on thyristor TH if the voltage between terminals A1 and A2 is negative.

As compared with the switch of FIG. 2, the switch of FIG. 3 has the advantage of comprising a single control terminal G referenced to only one of the conduction terminals of the switch, which simplifies the implementation of its control.

As compared with the triac of FIG. 1, the switch of FIG. 3 has the advantage that the active portions of its two thyristors are insulated from each other, which limits risks of spurious turning-on of the inactive thyristor at the turning-off of the active thyristor.

Tests made on switches of the type described in relation with FIG. 3 have, however, shown that the switching performance of this type of switch remains relatively low, especially as compared with a switch of the type described in relation with FIG. 2. A possible explanation is that gates $G_{TH}$ and $G_{AGT}$ of the two thyristors are connected, which makes spurious carrier transfers between the two thyristors possible. A study has in particular shown that at the turning-off of thyristor AGT (at the end of a phase where a current flows from electrode A1 to electrode A2 of the switch), during the charge overlap phase in thyristor AGT, a relatively high current, typically in the order of a few mA, transits from thyristor AGT to thyristor TH via gates $G_{AGT}$ and $G_{TH}$ of the two thyristors. Further, at the turning-off of thyristor TH (at the end of a phase where a current flows from electrode A1 to electrode A2 of the switch), during a phase of charge overlap in thyristor TH, a current (lower) transits from thyristor TH to thyristor AGT via gates $G_{TH}$ and $G_{AGT}$.

According to an embodiment, a bidirectional power switch comprising an anode-gate thyristor and a cathode-gate thyristor connected in antiparallel is provided, the gates of the two thyristors being coupled to a same control terminal of the switch and at least one resistor or at least one diode separating the gates of the two thyristors.

Figure 4:
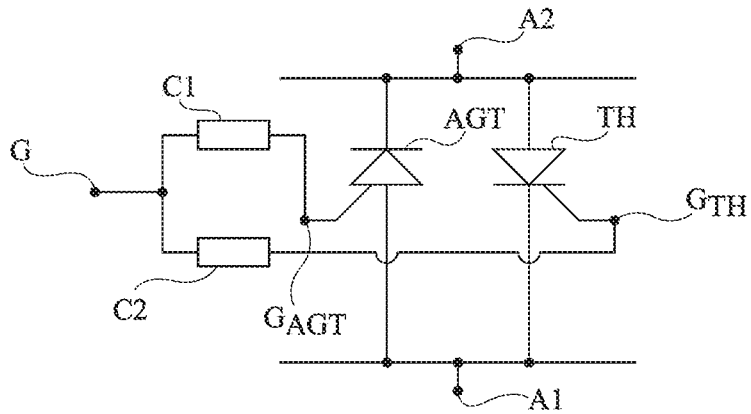
FIG. 4 is a simplified representation of an embodiment of a bidirectional power switch.

FIG. 4 is a simplified representation of an embodiment of a bidirectional power switch. The switch of FIG. 4 comprises a cathode-gate thyristor TH and an anode-gate thyristor AGT connected in antiparallel. As in the example of FIG. 3, thyristors TH and AGT are insulated from each other, that is, they are formed in different semiconductor chips, or they are integrated in a same semiconductor chip but separated from each other by an insulating region. The anode of thyristor AGT and the cathode of thyristor TH are connected to a first main terminal or conduction terminal A1 of the switch. The cathode of thyristor AGT and the anode of thyristor TH are connected to a second main terminal or conduction terminal A2 of the switch.

In the example of FIG. 4, an element C1 couples cathode gate $G_{AGT}$ of thyristor AGT to a control terminal G of the switch, and an element C2 couples anode gate $G_{TH}$ of thyristor TH to terminal G. Element C1 is a dipole circuit having a first end connected to gate $G_{AGT}$ of thyristor AGT and having its other end connected to terminal G, and element C2 is a dipole circuit having a first end connected to gate $G_{TH}$ of thyristor TH and having its other end connected to terminal G. Each of elements C1 and C2 may be a resistor, a diode, or a simple conductive track (or conductive wire), for example, made of metal. At least one of elements C1 and C2, however, is a resistor or a diode, so that anode gate $G_{AGT}$ of thyristor AGT and cathode gate $G_{TH}$ of thyristor TH are not directly connected to each other. In the case where element C1 or C2 is a resistor, the resistance is selected to be much greater than the normal resistance of a conductive track or of a conductive wire, for example, greater than or equal to 10 ohms.

Several possibilities will occur to those skilled in the art as to the selection of elements C1 and C2 enabling to obtain the desired effect, that is, the limitation or the suppression of parasitic currents flowing between the two thyristors via their respective gate electrodes, while keeping the possibility of controlling the switch via a single control terminal G referenced to one only of its conduction electrodes A1 and A2.

As a preamble, it should be noted that the described embodiments may apply whatever the types of turning-on and the structures of thyristors TH and AGT. In particular, thyristors TH and AGT may be thyristors which turn on in quadrant Q1 or Q2. A thyristor turning on in quadrant Q1 is a thyristor which may be controlled to be turned on by injection of a positive current into its gate when its anode-cathode voltage is positive. A thyristor turning on in quadrant Q2 is a thyristor which may be controlled to be turned on by injection of a negative current into its gate when its anode-cathode voltage is positive. In the following, TH_Q1 designates a cathode-gate thyristor TH of the type which turns on in quadrant Q1, TH_Q2 designates a cathode-gate thyristor TH of the type which turns on in quadrant Q2, AGT_Q1 designates an anode-gate thyristor AGT of the type which turns on in quadrant Q1, and AGT_Q2 designates an anode-gate thyristor AGT of the type which turns on in quadrant Q2. Further, for thyristors TH and AGT having vertical structures, whatever the selected type of turning-on, the structure of thyristor TH or AGT may be such that the conduction terminal of the thyristor to which the gate is referenced (that is, the cathode for thyristor TH and the anode for thyristor AGT) is on the same surface of the thyristor as the gate terminal (conventional vertical structure) or on the thyristor surface opposite to the gate (so-called ACS-type vertical structure). The described embodiments are however not limited to thyristors TH and AGT having a vertical structure, and may in particular be implemented by using thyristors TH and AGT having a planar structure. More generally, thyristors TH and AGT may be formed in any known technology and according to any known layout of cathode gate thyristors and of anode-gate thyristors.

The selection of elements C1 and C2 will be performed according to the type of thyristors TH and AGT used.

As an example, thyristors TH and AGT respectively are of type TH_Q2 and AGT_Q2, that is, which can be turned on by a negative current. In this case, element C1 may be a diode having its anode connected to gate $G_{AGT}$ of thyristor AGT and having its cathode connected to terminal G, and element C2 may be a diode having its anode connected to gate $G_{TH}$ of thyristor TH and having is cathode connected to terminal G. In such a configuration, the switch is turned on by application of a negative current on its terminal G (referenced to terminal A1). On switching to the off state, diodes C1 and C2 block possible spurious currents capable of flowing from gate $G_{AGT}$ of thyristor AGT to gate $G_{TH}$ of thyristor TH, or from gate $G_{TH}$ of thyristor TH to gate $G_{AGT}$ of thyristor AGT.

As a variation, thyristors TH and AGT respectively are of type TH_Q1 and AGT_Q1, that is, which can be turned on by a positive current. In this case, elements C1 and C2 may be diodes forward-connected respectively between terminal G and gate $G_{AGT}$ of thyristor AGT and between terminal G and gate $G_{TH}$ of thyristor TH. The switch may then be turned on by application of a positive current on its terminal G (referenced to terminal A1). On switching to the off state, diodes C1 and C2 block possible parasitic currents capable of flowing from gate $G_{AGT}$ of thyristor AGT to gate $G_{TH}$ of thyristor TH, or from gate $G_{TH}$ of thyristor TH to gate $G_{AGT}$ of thyristor AGT.

More generally, other choices of combination and of orientation of elements C1 and C2 may be made according to the quadrants where the switch is desired to be controlled.

As a variation, one and/or the other of elements C1 and C2 may be a resistor, for example, having a value in the range from 10 to 200 ohms, which enables, rather than blocking, to significantly limit spurious carrier transfers between the two thyristors via their gates $G_{AGT}$ and $G_{TH}$.

As a variation, one and/or the other of elements C1 and C2 may be a resistor series-connected with a diode.

An advantage of the embodiment described in relation with FIG. 4 is that it enables, with a relatively limited cost, to significantly improve the switching performance of a switch of the type described in relation with FIG. 3. It should in particular be noted that elements C1 and/or C2 added with respect to the switch of FIG. 3 have a relatively low cost since these elements are not intended to withstand high powers, but only to block and/or limit parasitic currents flowing between the gates of the two thyristors.

As an example, thyristors AGT and TH may be two different semiconductor chips assembled in a same protection package comprising four external connection terminals respectively connected to terminals A1, A2, $G_{AGT}$, and $G_{TH}$. Such a configuration leaves a possibility to the designer of the application circuit to personally select elements C1 and C2 to be added, according to the constraints of the application.

The described embodiments are however not limited to this specific case. As a variation, elements C1 and/or C2 are arranged in the same protection package as thyristors TH and AGT, where this package can then only comprise three external connection terminals respectively connected to terminals A1, A2, and G of the switch.

As a variation, thyristors TH and AGT are integrated in a same semiconductor chip and separated by an insulating region. Elements C1 and/or C2 may then either be discrete components or be integrated in the chip comprising thyristors TH and AGT.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A bidirectional power switch, comprising:
   first and second thyristors insulated from each other and connected in antiparallel between first and second conduction terminals, the first thyristor being an anode-gate thyristor, the second thyristor being a cathode-gate thyristor, and gate terminals of the first and second thyristors being connected to a same control terminal of the switch,
   wherein a circuit element selected from the group consisting of at least one diode and at least one resistor is connected to separate the gate terminal of the first thyristor from being directly connected to the gate terminal of the second.

2. The switch of claim 1, wherein the circuit element comprises a first dipole connecting the gate terminal of the first thyristor to the control terminal and a second dipole connecting the gate terminal of the second thyristor to the control terminal,
   wherein the first dipole dipoles comprises a circuit selected from the group consisting of a resistor, a diode, a series association of a diode and of a resistor, a conductive wire and a conductive track, and the second dipoles comprises a circuit selected from the group consisting of a diode and a resistor.

3. The switch of claim 2, wherein the first dipole is a diode having its anode connected to the gate terminal of the first thyristor and having its cathode connected to the control terminal, and wherein the second dipole is a diode having its anode connected to the gate terminal of the second thyristor and having its cathode connected to the control terminal.

4. The switch of claim 3, wherein the first and second thyristors are of a type turning on in quadrant Q2.

5. The switch of claim 2, wherein the first dipole is a diode having its cathode connected to the gate terminal of the first thyristor and having its anode connected to the control terminal, and wherein the second dipole is a diode having its cathode connected to the gate terminal of the second thyristor and having its anode connected to the control terminal.

6. The switch of claim 5, wherein the first and second thyristors are of a type turning on in quadrant Q1.

7. The switch of claim 2, wherein the first dipole comprises a resistor having a value greater than 10 ohms and less than 200 ohms.

8. The switch of claim 2, wherein the first and second thyristors are arranged in a same protection package comprising four external connection terminals respectively connected to the first and second conduction terminals of the switch, to the gate terminal of the first thyristor, and to the gate terminal of the second thyristor, and wherein the first and second dipoles are arranged outside of the package.

9. The switch of claim 2, wherein the first and second thyristors and the first and second dipoles are arranged in a same protection package comprising three external connection terminals respectively connected to the first and second conduction terminals and to the control terminal of the switch.

10. The switch of claim 9, wherein the first and second dipoles are integrated in a semiconductor chip comprising one or more of the first and second thyristors.

11. The switch of claim 9, wherein the first and second dipoles are discrete components placed on a semiconductor chip comprising one or more of the first and second thyristors.

12. The switch of claim 1, wherein the first and second thyristors are arranged in different semiconductor chips.

13. The switch of claim 1 wherein the first and second thyristors are integrated in a same semiconductor chip and are separated by an insulating region.

14. The switch of claim 1, wherein the circuit element is a resistor, and wherein the resistor has a resistance of greater than 10 ohms and less than 200 ohms.

15. A switch, comprising:
    a first thyristor having a cathode terminal coupled to a first switch terminal and an anode terminal coupled to a second switch terminal, said first thyristor having an anode gate terminal;
    a second thyristor having a cathode terminal coupled to the second switch terminal and an anode terminal coupled to the first switch terminal, said first thyristor having a cathode gate terminal, wherein the first thyristor and the second thyristor are insulated from each other;
    a first dipole circuit connected between the anode gate terminal and a third switch terminal; and
    a second dipole circuit connected between the cathode gate terminal and the third switch terminal;
    wherein one of the first and second dipole circuits comprises a circuit selected from the group consisting of a resistor and a diode.

16. The switch of claim 15, wherein another one the first and second dipole circuits comprises a circuit selected from the group consisting of a resistor and a diode.

17. The switch of claim 15, wherein another one the first and second dipole circuits comprises a conductive line.

18. The switch of claim 15, wherein said one of the first and second dipole circuits comprises a series connection of the diode and the resistor.

19. The switch of claim 15, wherein one of the first and second dipole circuits is the resistor, and wherein the resistor has a resistance of greater than 10 ohms and less than 200 ohms.

* * * * *